United States Patent [19]
Baek

[11] Patent Number: 5,905,452
[45] Date of Patent: May 18, 1999

[54] CURRENT SOURCE CELL APPARATUS FOR DIGITAL/ANALOG CONVERTER

[75] Inventor: Daebong Baek, Kyungki-Do, Rep. of Korea

[73] Assignee: LG Semicon Co., Ltd., Cheongju, Rep. of Korea

[21] Appl. No.: 08/931,888

[22] Filed: Sep. 17, 1997

[30] Foreign Application Priority Data

Nov. 8, 1996 [KR] Rep. of Korea ............... 96/52789

[51] Int. Cl.$^6$ ................................. H03M 1/66
[52] U.S. Cl. ................................. 341/136; 341/144
[58] Field of Search ............... 341/144, 154, 341/131, 136, 153

[56] References Cited

U.S. PATENT DOCUMENTS 5,162,800  11/1992  Ogawara ................. 341/144
5,760,725   7/1998  Yoshida et al. .......... 341/144

OTHER PUBLICATIONS

Takahiro MIKI et al., "An 80 MHz 8–bit CMOS D/A Converter," Reprinted from IEEE J. Solid–State Circuits, vol. SC–21, No. 6, pp. 983–988, Dec. 1986.

*Primary Examiner*—Brian Young
*Attorney, Agent, or Firm*—Fleshner & Kim

[57] ABSTRACT

An improved current source cell apparatus for a digital/analog converter which is capable of off-setting noises and obtaining a faster current switching by using different type current source cells which are alternately arranged, thus being well adaptable to a high frequency digital/analog converter. First current source cells receive a first bias voltage, a second bias voltage, and an inverted second voltage, respectively, and are enabled when the second bias voltage is a low level signal. A plurality of second current source cells are connected alternatingly with the first current source cells, and also receive the first bias voltage, the second bias voltage, and the inverted second bias voltage, respectively, and are enabled when the second bias voltage is a high level signal. A load resistor is commonly connected with the output terminals of the first and second current source cells through a common node, for thus obtaining an output voltage drop thereacross as an analog signal.

3 Claims, 3 Drawing Sheets

CURRENT SOURCE CELL APPARATUS FOR DIGITAL/ANALOG CONVERTER

BACKGROUND OF THE INVENTION

1. Field of the Invention

The present invention relates to a current source cell apparatus for a digital/analog converter, and in particular to an improved current source cell apparatus for a digital/analog converter which is capable of reducing noise which occurs due to switching of the current source cell, for thus obtaining a faster setting and being well suited to a high frequency digital/analog converter.

2. Description of the Conventional Art

FIG. 1 is a circuit diagram illustrating a conventional current source cell for a digital/analog converter, which was disclosed in Miki, T. et al., "An 80-Mhz 8-bit CMOS D/A converter", IEEE Journal of solid-state Circuits, Vol. SC-21, No. 6, December 1986, PP. 370–375.

As shown in the above-mentioned article, a conventional current source cell for a digital/analog converter includes a row decoder and column decoder for decoding an input digital signal, and a plurality of current source cells are arranged in a matrix and selected by the row decoder and column decoder for generating a source current.

In each conventional current source cell, there are provided a first NMOS transistor Q1 having its gate connected to receive a first bias voltage VG1, and its source connected to a ground potential Vss. A second NMOS transistor Q2 has its source connected with the drain of the first NMOS transistor Q1, its gate connected to receive a second bias voltage D, and its drain connected to a supply voltage Vcc. A third NMOS transistor Q3 has its source connected with the drain of the first NMOS transistor Q1, its gate connected to receive an inverted complementary voltage DB of the second bias voltage terminal Vout. A load resistor R1 receiving the supply voltage Vcc is also connected with the output voltage terminal Vout. A capacitor shown connected between the gate and drain of transistor Q3 in FIG. 1 represents a stray capacitance between DB and Vout.

The conventional current source cells in the matrix array are all commonly connected to the output voltage terminal Vout.

The operation of the conventional current source cell will now be explained with reference to FIG. 1.

The NMOS transistor Q1 is a current source transistor and controls the level of a full scale current in accordance with the first bias voltage Vg1. The NMOS transistors Q2 and Q3 are current switches and are operated in saturation.

When the NMOS transistor Q2 is turned on in accordance with the second bias voltage D, the NMOS transistor Q3 is turned off in accordance with the inverter voltage DB complement of the second bias voltage D, so that current is not applied to the output voltage terminal Vout.

On the contrary, when the NMOS transistor Q2 is turned off in accordance with the second bias voltage D, the NMOS transistor Q3 is turned on by the inverted voltage DB complement of the second bias voltage D, so that a predetermined level of current flows to the ground voltage Vss, the output voltage Vout is determined by the resistor R1. Therefore, the level of the output analog signal is determined.

Namely, when the NMOS transistor Q1 is turned on and the NMOS transistor Q3 is turned on, the supply voltage Vcc is applied across the load resistor R1, and the level of the output voltage is determined in accordance with the voltage drop due to the load resistor R1.

However, when the conventional current source cell is switched, digital switching noise affects the current source, so that a predetermined time lapse is needed until the output voltage has a stable level. Such predetermined time lapse is called the "Setting time", when is an important factor which determines the performance of the digital/analog converter.

FIG. 2 is a circuit diagram illustrating another conventional current source cell for a digital/analog converter, as was disclosed in U.S. Pat. No. 4,904,922.

As shown therein, this conventional current source cell for a digital/analog converter includes a first PMOS transistor Q10 the gate of which receives a first bias voltage Vg1, the source of which receives the supply voltage Vcc, and the drain of which is connected with a common node Vx, a second PMOS transistor Q20 the gate of which receives a second bias voltage D, the source of which is connected with the drain of the first PMOS transistor Q10 through the common node Vx, and the drain of which is connected with a ground voltage Vss, a third PMOS transistor Q30 the source of which is connected with the drain of the first PMOS transistor Q10 through the common node Vx, the gate of which receives a reference voltage RVg, and the drain of which is connected to an output voltage terminal Vout, and a load resistor R1 connected between the drain of the third PMOS transistor Q30 and the ground voltage Vss.

The PMOS transistor Q10 is a current source transistor and determines the level of the current, and the PMOS transistor Q20 is a switching transistor and switches the current being applied to the output voltage terminal Vout.

Namely, when the PMOS transistor Q20 is turned off, a current determined by the PMOS transistor Q10 is applied to the output voltage terminal Vout through the PMOS transistor Q30 which determines the analog output. In addition, when the PMOS transistor Q20 is turned on, the electric potential of the common node Vx becomes the ground voltage Vss, and no current is applied to the output voltage terminal Vout.

Here, the PMOS transistor Q30 is operated in the saturated region by the reference voltage RVg.

As described above, this second conventional current source cell apparatus is directed to preventing the noise generated due to the second bias voltage D from being transferred to the current source by using the PMOS transistor Q30 which is controlled by the reference voltage RVg; however, it degards to obtain a faster switching operation becase of the delay time of another transistor Q30 is impossible to obtain a faster switching operation, thus causing a slow digital/analog conversion.

SUMMARY OF THE INVENTION

Accordingly, it is an object of the present invention to provide a current source cell apparatus for a digital/analog converter which overcomes the aforementioned problems encountered in the conventional art.

It is another object of the present invention to provide a current source cell apparatus for a digital/analog converter which is capable of reducing noise which occurs due to a switching of a current source cell, for thus obtaining a faster settling and being well adaptable to a high frequency digital/analog converter.

It is another object of the present invention to provide a current source cell apparatus for a digital/analog converter which is capable of off-setting switching noise due to a faster current switching by using different type current source cells which are alternately arranged, for thus being well adaptable to a high frequency digital/analog converter.

To achieve the above objects, there is provided a current source cell apparatus for a digital/analog converter which includes a plurality of first current source cells which each receive a first bias voltage, a second bias voltage, and an inverted second bias voltage, respectively, and which are each enabled when the second bias voltage is a low level signal, a plurality of second current source cells which are connected alternatingly with the fist current source cells, each receive the first bias voltage, the second bias voltage, and the inverted second bias voltage, respectively, and which are each enabled when the second bias voltage is a high level signal, and a load resistor which is commonly connected with output terminals of the first current source cells and second current source cells through a common node, for thus obtaining an output voltage thereacross as an analog signal voltage.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 3A:
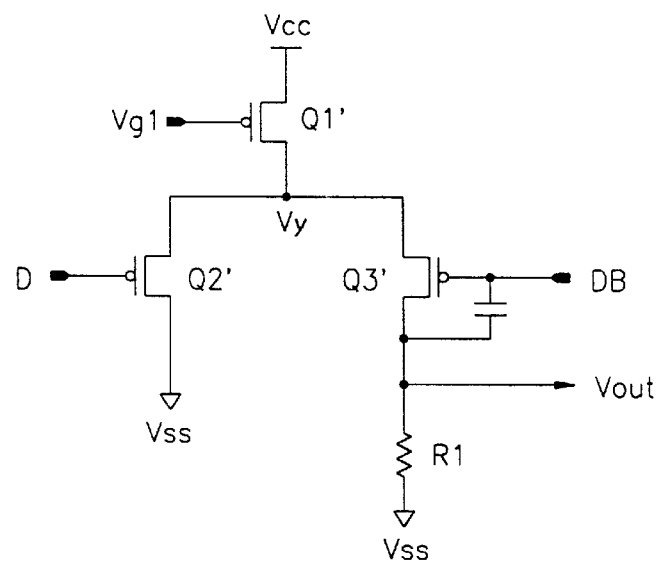
FIG. 3A is a circuit diagram illustrating an A-type current source cell for a digital/analog converter according to the present invention.
Figure 3B:
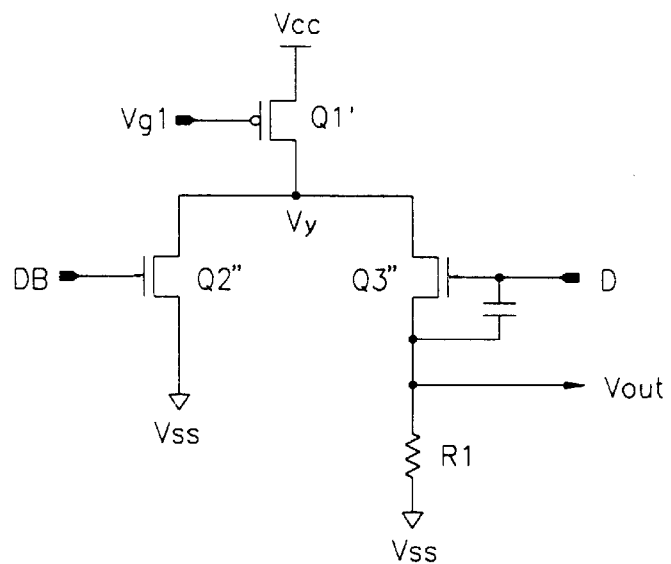
FIG. 3B is a circuit diagram illustrating a B-type current source cell for a digital/analog converter according to the present invention.

FIG. 3A is a circuit diagram illustrating an A-type current source cell for a digital/analog converter according to the present invention, and FIG. 3B is a circuit diagram illustrating a B-type current source cell for a digital/analog converter according to the present invention.

As shown in FIG. 3A, the A-type current source cell includes a first PMOS transistor Q1', the gate of which receives a first bias voltage Vg1, the source of which receives the supply voltage Vcc, and the drain of which is connected with a common node Vx, a second PMOS transistor Q2' the gate of which receives a second bias voltage D, the source of which is connected with the drain of the first PMOS transistor Q1' through the common node Vx, and the drain of which is connected to the ground voltage Vss, a third PMOS transistor Q3' the source of which is connected with the drain of the first PMOS transistor Q1' through the common node Vx, the gate of which receives an inverted voltage DB complementary of the second bias voltage D, and the drain of which is connected with an output voltage terminal Vout, and a load resistor R1 connected between the drain of the third PMOS transistor Q3' and the ground Vss.

Figure 1:
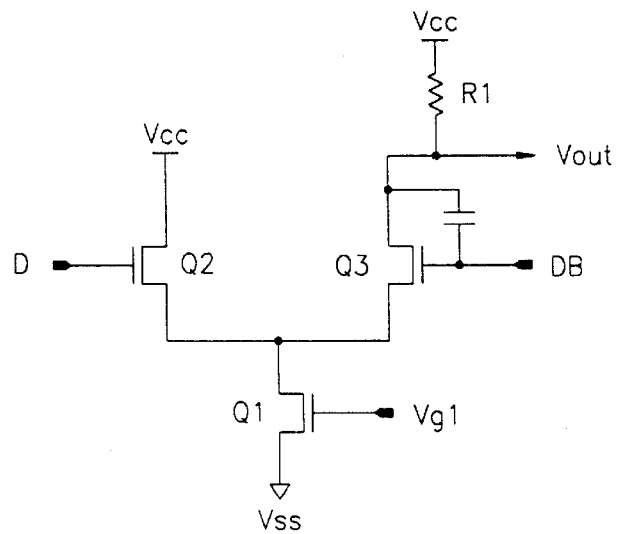
FIG. 1 is a circuit diagram illustrating a conventional current source cell for a digital/analog converter.
Figure 2:
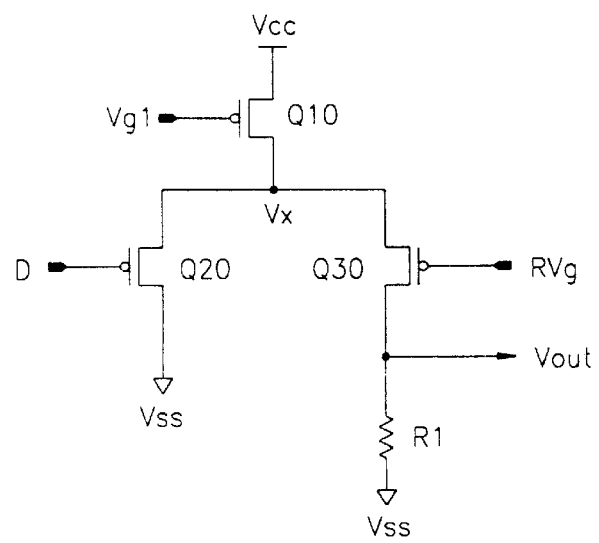
FIG. 2 is a circuit diagram illustrating another conventional current source cell for a digital/analog converter.

It will be seen that the A-type current source cell shown in FIG. 3A corresponds to the conventional current source cell as shown in FIG. 2.

As shown in FIG. 3B, the B-type current source cell includes a PMOS transistor Q1' the gate of which receives a first bias voltage Vg1, the source of which receives a supply voltage Vcc, and the drain of which is connected with a common node Vx, a first NMOS transistor Q3" the drain of which is connected with the drain of the PMOS transistor Q1' through the common node Vx, the gate of which is connected with an output voltage terminal Vout, a second transistor Q2" the gate of which receives an inverted voltage DB complementary of the second bias voltage D, the drain of which is connected with the drain of the PMOS transistor Q1 through the common node Vx, and the source of which is connected with a ground voltage Vss, and a load resistor R1 connected between the output voltage terminal Vout and the ground voltage Vss.

It will be seen that compared to PMOS switching transistors Q2' and Q3' receiving the gate voltage D, /DB, respectively in the a-type current source cell of FIG. 3A, in the B-type current cell of FIG. 3B the switching transistors Q2" and Q3" are NMOS transistors, and receive the gate voltages /DB, D, respectively.

Figure 4:
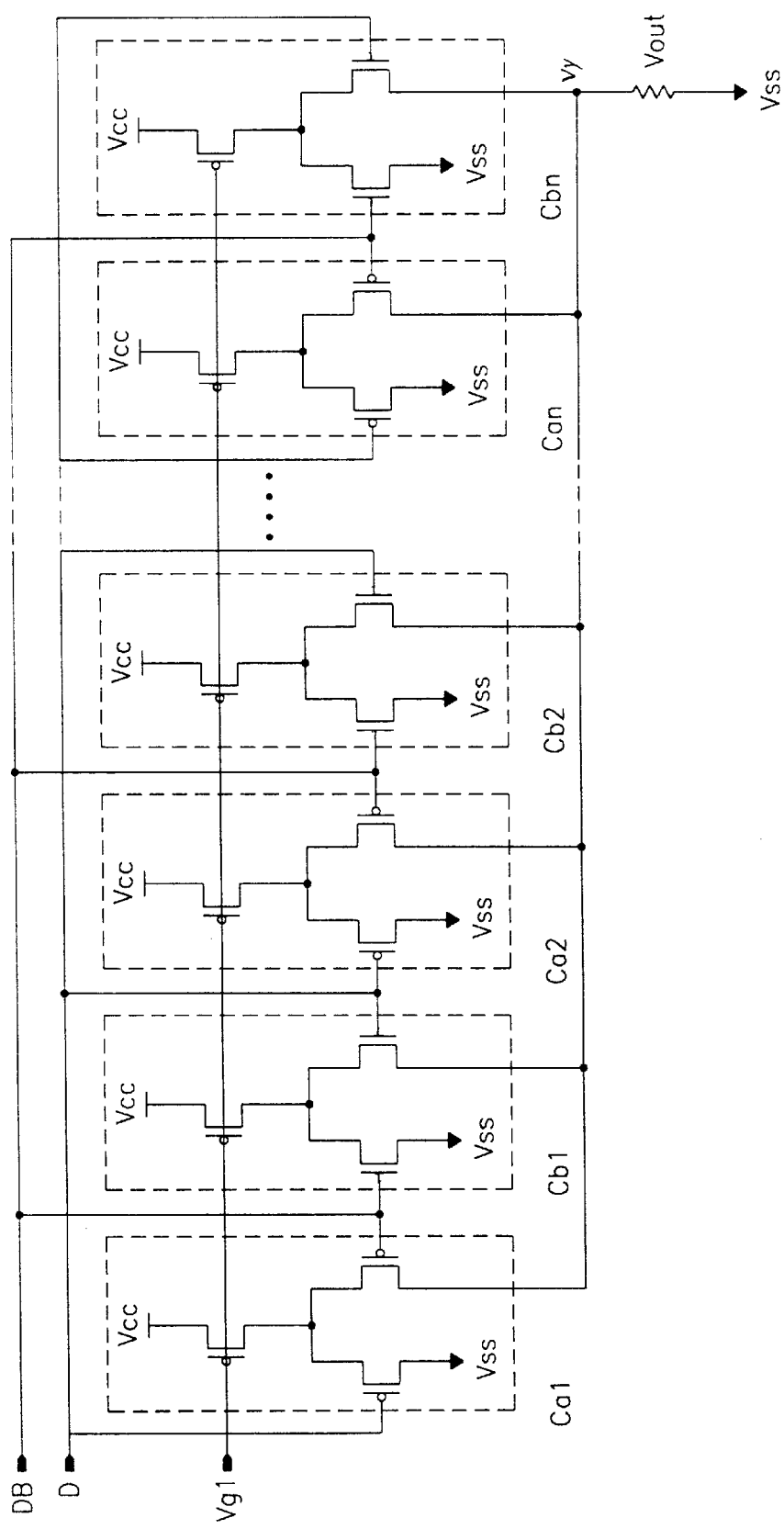
FIG. 4 is a circuit diagram illustrating a current source cell apparatus for a digital/analog converter according to the present invention.

FIG. 4 is a circuit diagram illustrating a current source cell apparatus for a digital/analog converter according to the present invention, which includes A-type current source cells Ca1 through Can for receiving the first bias voltage Vgl, the second bias voltage D, and the inverted second bias voltage Db, respectively, B-type current source cells Cb1 through Cbn alternatingly connected between the A-type current source cells Ca1 through Can, and receiving the first bias voltage Vgl, the second bias voltage D, and the inverted second bias voltage DB, and a load resistor RL commonly connected with the output terminals of the current source cells Ca1 through can and the current source cells Cb1 through Cbn through a common node Vy and to ground Vss, for thus obtaining an output voltage Vout of an analog signal based on the voltage drop across resistor RL.

The operation of the current source cell apparatus for a digital/analog converter according to the present invention will now be explained with reference to the accompanying drawings.

First, in the conventional art, since the current source cells are enabled by a low or high level voltage input to the switching transistor gates, noise having the same components is transferred to the analog signal output terminal due to charging and discharging of the stray capacitances and thus increasing the settling time.

In the present invention, in order to decrease, the settling time, the current source cells Ca1 through Can which are enabled by a low level gate switching voltage and the current source cells Cb1 through Cbn which are enabled by a high level gate voltage switching are alternately connected.

Namely, when the second bias voltage D is high level, and fro the inverted voltage DB complementary of the second bias voltage D is low level, the PMOS transistors Q2' which are included in the current source cells Ca1 through Can and act as the current switches and receive the second bias voltage D through the gates thereof. Therefore, the current source cells Ca1 through Can are enabled, and the current from the enabled current source cells Ca1 through Can are applied to the common node Vy.

The NMOS transistors Q3" which act as the current switches and are included in the current source cells Cb1 through Cbn, receive the high level second bias voltage D through the gates thereof, and are turned on, whereas the transistors Q2" receiving the low level gate voltage DB are turned off. Therefore, the current source cells Cb1 through Cbn are enabled, and the currents from the enabled current source cells Cb1 through Cbn are applied to the common node Vy.

Therefore, the output voltage Vout which is the voltage across the load resistor RL is obtained based on the enabled current source cells Ca1 through Can and current source cells Cb1 through Cbn.

Since the current source cells Ca1 through Can and the current source cells Cb1 through Cbn are enabled by the opposing voltage levels, the noise which occurs at the common node Vy due to the current source cells Ca1 through can and the noise which occurs at the common node Vy due to the current source cells Cb1 through Cbn are off-set. As a result, the noise which occurs at the common node Vy is decreased, for thus decreasing the delay time (namely, the settling time) until the output analog signal obtained a stable level.

As described above, the current source cell apparatus for a digital/analog converter according to the present invention is capable of off-setting the noises and achieving faster current switching by using different type current source cells which are alternately arranged with one another, for thus increasing the switching speed. Therefore, the current source cell apparatus for a digital/analog converter is well adaptable to a high frequency digital/analog converter which requires a faster switching speed and less noises.

Although the preferred embodiment of the present invention has been disclosed for illustrative purposes, those skilled in the art will appreciate that various modifications, additions and substitutions are possible, without departing from the scope and spirit of the invention as recited in the accompanying claims.

What is claimed is:

1. A current source cell apparatus for a digital/analog converter, comprising:

a plurality of first current source cells which each receive a first bias voltage, a second bias voltage, and an inverted second bias voltage, respectively, and which are each enabled when the second bias voltage is a low level signal;

a plurality of second current source cells which are connected alternatingly with the fist current source cells, each receive the first bias voltage, the second bias voltage, and the inverted second bias voltage, respectively, and which are each enabled when the second bias voltage is a high level signal; and a load resistor which is commonly connected with output terminals of the first current source cells and second current source cells through a common node, for thus obtaining an output voltage thereacross as an analog signal voltage.

2. The apparatus of claim 1, wherein each first current source cell includes:

a first PMOS transistor a gate of which receives the first bias voltage, a source of which receives a supply voltage, and a drain of which is connected with the common node;

a second PMOS transistor a gate of which receives the second bias voltage, a source of which is connected with the drain of the first PMOS transistor through the common node, and a drain of which is connected with a ground voltage;

a third PMOS transistor a source of which is connected with the drain of the first PMOS transistor through the common node, a gate of which receives the inverted second bias voltage, and a drain of which is connected with an output voltage terminal; and a load resistor connected between the drain of the third PMOS transistor and the ground voltage.

3. The apparatus of claim 1, wherein each second current source cell includes:

a PMOS transistor a gate of which receives the first bias voltage, a source of which receives a supply voltage, and a drain of which is connected with a common node;

a first NMOS transistor a drain of which is connected with the drain of the PMOS transistor through the common node, a gate of which receives the second bias voltage, and a source of which is connected with an output voltage terminal; and a second NMOS transistor a gate of which receives the inverted second bias voltage, a drain of which is connected with the drain of the PMOS transistor, and a source of which is connected with a ground voltage; and a load resistor connected between the drain of the first NMOS transistor and the ground voltage.

* * * * *